United States Patent [19]

Huber et al.

[11] Patent Number: 4,595,966
[45] Date of Patent: Jun. 17, 1986

[54] FOR THE PROTECTION OF AN MOS-TRANSISTOR FROM OVERLOADING

[75] Inventors: Anton Huber, Schwindegg; Jenö Tihanyi, Munich, both of Fed. Rep. of Germany

[73] Assignee: Siemens Aktiengesellschaft, Fed. Rep. of Germany

[21] Appl. No.: 547,920

[22] Filed: Nov. 2, 1983

[30] Foreign Application Priority Data

Nov. 24, 1982 [DE] Fed. Rep. of Germany ....... 3243467

[51] Int. Cl.⁴ ............................................. H02H 3/093
[52] U.S. Cl. ........................................ 361/93; 361/98; 361/101
[58] Field of Search ..................... 361/91, 93, 98, 100, 361/101

[56] References Cited

U.S. PATENT DOCUMENTS 4,363,068  12/1982  Burns .............................. 361/100 X
4,423,457  12/1983  Brajder ........................... 361/98 X

FOREIGN PATENT DOCUMENTS 3034927  3/1982  Fed. Rep. of Germany ...... 361/101
2034550  6/1980  United Kingdom ................. 361/98
2075297  11/1981  United Kingdom .

Primary Examiner—Harry E. Moose, Jr.
Attorney, Agent, or Firm—Scully, Scott, Murphy & Presser

[57] ABSTRACT

An arrangement for the protection of a transistor, particularly a MOS-switching transistor including a zener diode connected between the gate and source terminals for limiting the gate potential and a switch-off transistor connected to the control circuit of the MOS-transistor for grounding the gate thereof and switching it off. First and second monitoring circuits are coupled between the MOS-transistor and the switch-off transistor for producing a signal switching on the switch-off transistor in response to a drop in the load current and an increase in the output voltage of the MOS-transistor. First and second timing circuits block the signals of the monitoring circuits for predetermined intervals.

5 Claims, 1 Drawing Figure

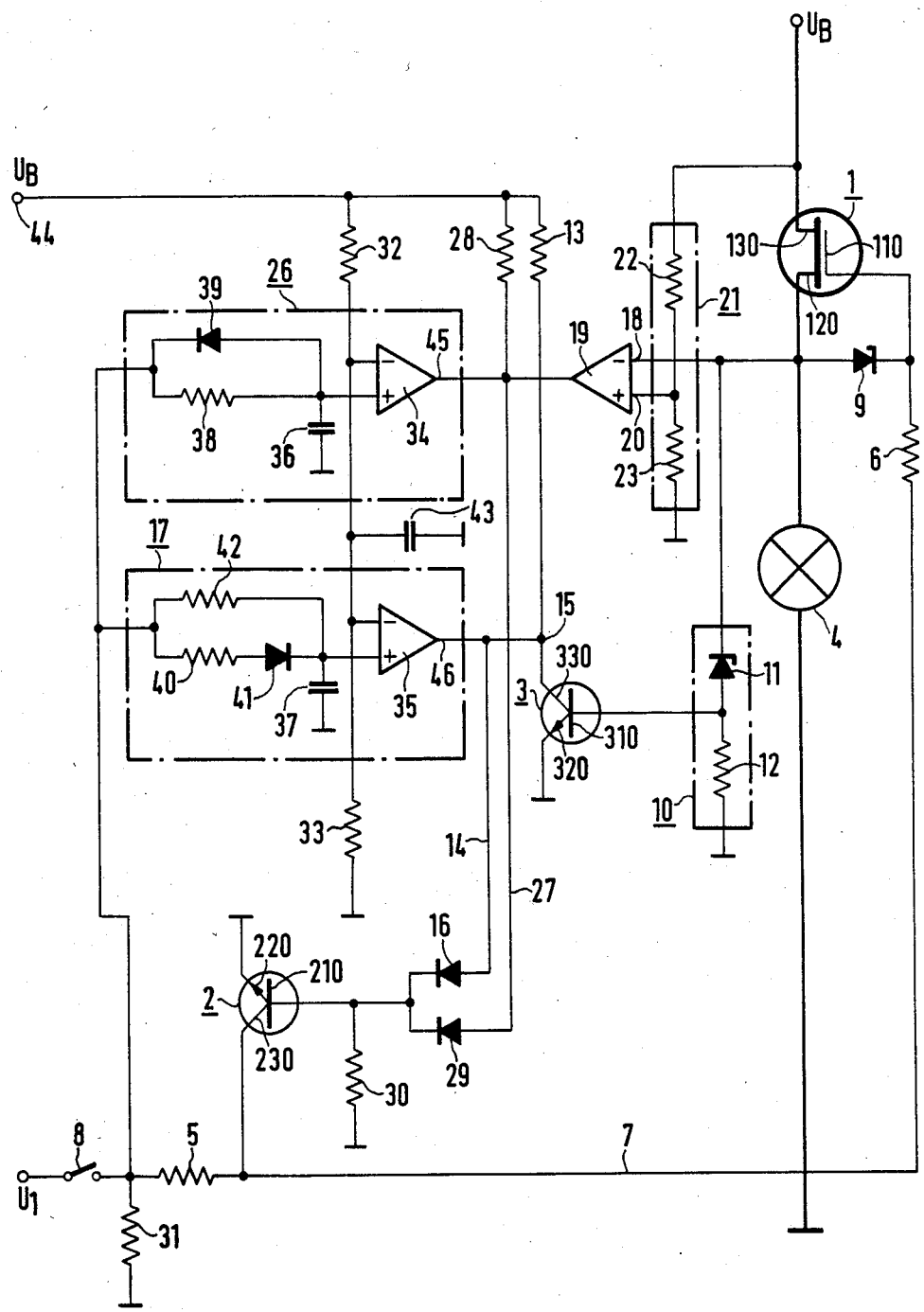

FOR THE PROTECTION OF AN MOS-TRANSISTOR FROM OVERLOADING

BACKGROUND OF THE INVENTION

1. Field of the Invention

The present invention relates to a method and an arrangement for the protection of a transistor, particularly an MOS switching transistor which is located in the lamp circuit of a motor vehicle, by limiting the gate potential and thereby the load current and through monitoring of the source potential whereby, upon deviation from a predetermined value, the load current through the MOS transistor is interrupted, inasmuch as the MOS-transistor is blocked through the intermediary of a switching element having a control input and two load connections, and which is conductively controllable by means of a potential.

Electronic switches for high load currents which, for example, find application in the lamp circuit of motor vehicles, operate with a transistor which is connected in series in the lamp circuit. This transistor must be protected from overload through appropriate measures, when it is desired to avoid the need for oversized transistors. Thus, the current in the lamp circuit should not exceed a maximum value, even in the case when a short circuit is encountered in the lamps.

2. Discussion of the Prior Art

A circuit is presently known which, on the one hand, limits the potential which is present at the base of the transistor through the intermediary of a Zener diode and, consequently, the transistor current between the emitter and the collector, and which, on the one hand, monitors the potential at the collector of the transistor, in order to protect the transistor during the occurrence of a short circuit in the lamp circuit, as is disclosed in Laid-open German Patent Application No. OS 30 15 831. This circuit operates with an ohmic resistance in the lamp circuit, which is sized so that the voltage drop-off thereon, in conjunction with the voltage drop-off at the emitter-base section of the transistor, can exceed the threshold voltage of the Zener diode.

However, the arrangement of an ohmic resistance in the lamp circuit causes an undesireable power loss.

SUMMARY OF THE INVENTION

Accordingly, it is an object of the present invention to find a method and to develop an arrangement of the above-described type which, irrespective of transistor and load resistances, wll be complete in the load circuit without the need for further resistances and, nevertheless, still fully protect the transistor from overload, even during a short circuit. For this purpose, use can be made of an MOS-transistor.

The foregoing object is inventively attained in that, in order to restrict the gate potential, the voltage between the gate and source of the MOS-transistor in limited, wherein for the monitoring of the source potential of the MOS-transistor, this is branched-off and compared with a predetermined threshold value, and upon dropping below the predetermined threshold value, after passage of a predetermined time interval, the control input of the switching element is subjected to a fixed battery potential which otherwise is connected to ground, which switching element will conduct the gate potential of the MOS transistor to ground through its two load terminals and thereby deactivate the transistor; and in order to monitor the source potential of the MOS-transistor there are compared the potential at its drain and at its source with each other and their difference with a predetermined threshold value; and upon exceeding the value, after passage of a predetermined time interval, the control input of the switching element is subjected to a fixed battery potential, which switching element through its two load terminals will conduct off the gate potential of the MOS-transistor to ground and thereby switch off the latter.

Immediately after the switching on, the filaments of lamps have an extremely low resistance which only increases with warming up. This will cause the initial flow of a higher current, which is to be limited as the drain-source current in the MOS-transistor which is to be protected.

By means of the invention there is eliminated an ohmic resistance which would limit the current in the lamp circuit and, nevertheless the drain-source current cannot exceed a predetermined threshold value. Moreover, it is also unnecessary to design the MOS-transistor for an extremely high drain-source current.

For the implementation of the method, it is advantageous to provide an arrangement with a Zener diode which is connected intermediate the gate and the consumer circuit, which Zener diode limits the gate potential of the MOS-transistor, and including a second transistor which, upon the deviation of the source potential at the MOS-transistor from a predetermined value, will block the flow of load current through the MOS-transistor.

In accordance with the invention, this arrangement is so constructed that the Zener diode is interposed between the gate and the source of the MOS-transistor for the limiting of the voltage; the base of a third transistor for monitoring the source potential is connected with the source of the MOS-transistor, with the emitter of the third transistor being grounded and its collector connected with a battery terminal which, through a branch line, joined with a first timing element, and through a first diode is connected in the transmissive direction with the base of the second transistor whose emitter is grounded and whose collector is connected with a supply line to the gate of the MOS transistor; and wherein an operational amplifier for monitoring, the source potential is connected by means of its two inputs with, respectively, the drain or the source of the MOS-transistor and its output with a battery terminal, which joined with a second timing element, is also connected through a second diode in the transmission direction with the base of the second transistor, whose emitter is grounded and whose collector is connected with a supply line for the gate of the MOS transistor.

Through limiting of the gate potential by the Zener diode, the drain-source current cannot exceed a threshold value which is determined by the selection of this Zener diode.

When there is already present a short circuit in the lamps at the switching on thereof, this is rapidly recognized through the monitoring of the source potential. This monitoring is effected by means of a third transistor which operates as an inverter. In the conductive condition, it conducts a battery potential to ground. However, the source potential of the MOS-transistor controls the base potential of the third transistor in such a manner that it blocks at a lower source potential, so that the battery potential stands available for further switching sequences. A first timing element of known functional mode activates this monitoring after a short time period, for example, after 30 μs.

In addition, there is effected a monitoring of the voltage drop-off at the MOS-transistor through the intermediary of an operational amplifier. Its output signal switches a line for the battery potential which stands available for further switching sequences. A second timing element activates this monitoring subsequent to a time interval which is larger by three to four decimal powers, for example, after 100 ms. The monitoring of the voltage drop-off provides the advantage that smaller defects can be rapidly recognized without any difficulty.

When the battery potential is transmitted to the base of the second transistor from the third transistor or from the output of the operational amplifier, the second transistor in its conductive condition grounds the supply line for the gate of the MOS-transistor. Thereby the MOS-transistor in the lamp circuit is switched off. Obtained hereby is also the advantage that the second transistor will again without delay free the lamp circuit when a potential is not longer present at its base.

The timing elements can be constructed so as to operate in a known manner, in that connections between the positive fixed battery potential and the base of the second transistor are first freed after the passage of predetermined time intervals. Hereby, the outputs of the timing elements are set at predetermined times on battery potential, and otherwise grounded.

The second timing element effectuates a time interval which is larger by three to four decimal powers than that of the first timing element. Tested herewith is initially the potential at the source of the MOS-transistor which is to be protected, prior to the commencement of the monitoring of the voltage drop-off at the MOS-transistor. The monitoring of the source potential at the MOS transistor which is to be protected responds when a short circuit is encountered already at the switching-on point in time, for example, in the lamp. As a result, this measurement is commenced prior to the monitoring of the voltage drop-off at the MOS transistor, which should recognize less important defects.

A mechanical switch for the manual on-off switching of the lamp circuit is advantageously arranged in the supply line for the gate of the MOS-transistor which is to be protected. When no voltage is present at the gate, then the MOS-transistor is blocked and the lamp circuit is interrupted. Accordingly, it is no longer necessary to build a switch into the lamp circuit which would present an undesireable ohmic resistance even in the closed, conductive condition. Arranged in the lamp circuit, besides the lamp, is only an MOS-transistor. When a field-effect transistor is employed, there only flows a drain-source current and no static gate currents. The power loss in the lamp circuit is thus minimal.

A further advantage of the inventive method consists in that the MOS-transistor is already protected at a short circuit encountered in a lamp at the time of switching on. Besides an overload protection for the MOS-transistor immediately after the switching on there is also effected a functional testing.

BRIEF DESCRIPTION OF THE DRAWING

Reference may now be had to the following detailed description of the invention, taken in conjunction with the single FIGURE of the drawing schematically illustrating a circuit diagram of an arrangement for implementing the method for the protection of an MOS-transistor from an overload.

DETAILED DESCRIPTION

In the lamp circuit of a motor vehicle, a lamp 4 and an MOS field-effect transistor 1 are connected in series. Additional lamps can also be connected in parallel with the lamp 4. The voltage supply is provided from a battery with the terminal potential $U_B$. A control potential $U_1$, for example, of 12 volts, reduced at the ohmic resistors 5 and 6, is conducted through a supply line 7 to the gate 110 of the MOS field-effect transistor 1. Arranged in the supply line 7 is a mechanical switch 8 for the manual on-off switching of the lamps 4.

Three complementary measures protect the MOS field effect transistor 1 from overloads, in that they limit the drain-source current, even in the presence of a short circuit in the lamps 4:

Firstly, a Zener diode 9 for, for example, 6.2 volts, is connected between the source 120 and 110 of the MOS field-effect transistor 1. The diode limits the gate potential, and thereby also the drain-source current.

Secondly, in order to be able to recognize a short circuit in the lamps 4 which is already present at the time of switching on, the source 120 of the MOS field-effect transistor 1 is connected through a voltage divider 10, consisting of a Zener diode 11 for, for example, 3.6 volts, and an ohmic resistor 12, to the base 310 of a third transistor 3. At the collector 330 of the third transistor 3 there is present a fixed potential which is produced from a battery potential $U_B$ of, for example, 24 volts, through reduction at an ohmic resistor 13. The emitter 320 is grounded. The potential is connected to ground as long as the base potential of the third transistor 3 is large. At other times, the potential is conducted through a line 14 to the base 210 of a second transistor 2. This conductor 14 begins at a junction 15 ahead of the collector 330 of the third transistor 3, contains a diode 16, and is set free by means of a first timing circuit 17, for example, about 30 μs shortly after actuation of the installation.

The collector 230 of the second transistor 2 is connected to the supply line 7 of the gate 110 of the MOS field-effect transistor 1. The emitter 220 of the second transistor 2 is grounded. For drawing off of a possible collector-base residual current, there serves an ohmic resistor 30 which is connected with the base 210 of the second transistor 2. When a potential is present at the base 210, current flows from the collector 230 to the emitter 220 so that the supply line 7 of the gate 110 of the MOS field-effect transistor 1 is grounded. The MOS field-effect transistor 1 is then switched off by potential present on the base 210 of the second transistor 2.

Thirdly, for further monitoring of the drain-source current which flows through the MOS field-effect transistor 1, the first input 18 of an operational amplifier 19 takes up the potential at the source 120, and the second input 20 of the potential at the drain 130 as modified by a voltage divider circuit 21. This voltage divider circuit 21 is formed by the two ohmic resistors 22 and 23. Upon the voltage dropping below a predetermined threshold value between the drain 130 and source 120 of the MOS field-effect transistor 1, the operational amplifier 19 frees a line 27, in the event that this has already been freed by a second timing element 26, for example, 100 ms after the actuation of the installation. This line 27 contains a diode 29 and conveys a fixed potential, which is produced from the battery potential $U_B$ of, for example, 24 volts, through reduction by an ohmic resistor 28, to the base 210 of the second transistor 2.

The two timing circuits 17 and 26 are both supplied from the potentials $U_1$ and $U_B$.

At each of the negative inputs of the operational amplifiers 34 and 35 there is present a fixed potential of, for example, 5 volts, which is obtained from the potential $U_B$ by means of a voltage divider circuit.

The voltage divider consists of two ohmic resistors 32 and 33 which are connected in series. Three tap-off connections between these resistors 32 and 33 are connected with the operational amplifiers 34 and 35 and with a capacitor 43, which stabilizes the voltage.

As long as the potentials at the positive inputs of the operational amplifiers 34 and 35 are lower than the potentials at the negative inputs, there are grounded the outputs 45 and 46 of the operational amplifiers 34 and 35, which are of known construction, so that the lines 14 and 27 are blocked in the accordance with the function.

The potential $U_1$ charges the capacitors 36 and 37, the sizes of which are selected such that they are fully charged after 100 ms or, respectively, 30 $\mu s$. After these time intervals, potentials are present at the positive inputs of the operational amplifiers 34 and 35 which are higher than 5 volts, so that their outputs 45 and 46 are no longer grounded and the lines 14 and 27 are cleared.

The charges of the capacitors 36 and 37 are conducted off through a resistor 31 after each deactivation.

The charging of the capacitor 36 is effected through an ohmic resistor 38, and its discharging is effected in an accelerated manner through a line in which there is arranged only a diode 39.

The capacitor 37 is charged through an ohmic resistor 40 having a diode 41 connected in series therewith, and is discharged in a time-delayed mode through a large ohmic resistor 42 of, for example, 100 k$\Omega$.

The diodes 39 and 41 respectively define the discharge and charge lines for the capacitors 36 and 37.

What is claimed is:

1. An arrangement for the protection of a switching MOS-transistor (1) having source and drain terminals forming a switching output (120, 130) connected between a load circuit containing a lamp (4) and a DC source (UB), and a gate terminal for switching on the MOS-transistor, comprising:
    a control circuit (U1, 8, 5, 7, 6) connected to the gate terminal of the MOS-transistor for producing a switch-on signal for switching on the MOS-transistor,
    a zener diode (9) connected between the gate and source terminals of the MOS-transistor for limiting the gate potential and thereby the load current through the drain and source terminals to a predetermined threshold value,
    a switch-off transistor (2) connected to the control circuit for rendering inoperative the switch-on signal when the switch-off transistor is switched on,
    a first monitoring circuit (10, 3) coupled between the source terminal of the MOS-transistor and the base of the switch-off transistor for producing a first switch-off signal to switch on the switch-off transistor for as long as the voltage drop at the load circuit is less than a minimum value,
    a first coupling diode (16) connected to conduct the first switch-off signal from the first monitoring circuit to the base of the switch-off transistor,
    a first timing element (17) connected to the first monitoring circuit which blocks the first switch-off signal for a first predetermined time interval,
    a second monitoring circuit (19, 22) coupled between the switching output and the switch-off transistor for producing a second switch-off signal to switch on the switch-off transistor when the voltage at the switching output exceeds a predetermined threshold value,
    a second coupling diode (29) connected to conduct the second switch-off signal from the second monitoring circuit to the base of the switch-off transistor, and
    a second timing element (26) connected to the second monitoring circuit which blocks the second switch-off signal for a second predetermined time interval.

2. The arrangement of claim 1 wherein the first monitoring circuit includes a transistor having a base coupled to the source terminal of the MOS-transistor through a zener diode, a grounded emitter, and a collector connected to the DC source and the first coupling diode.

3. The arrangement of claim 1 wherein the second monitoring circuit includes an operational amplifier having a first input connected to the DC source through a voltage divider and a second input connected to the source terminal of the MOS-transistor and an output connected to the second coupling diode.

4. The arrangement of claims 1 or 2 or 3 wherein said first and second timing elements each include an operational amplifier which is connected with a first input to the DC source and a second input to the control circuit through a resistance-capacitance circuit.

5. The arrangement of claim 1 wherein the first predetermined time interval of said first timing element is less than the second predetermined time interval of said second timing element.

* * * * *